(12) United States Patent
Wu et al.

(10) Patent No.: US 7,460,415 B2
(45) Date of Patent: Dec. 2, 2008

(54) DRAIN VOLTAGE REGULATOR

(75) Inventors: Yonggang Wu, Santa Clara, CA (US); Nian Yang, Mountain View, CA (US); Tien-Chun Yang, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 32 days.

(21) Appl. No.: 11/639,936

(22) Filed: Dec. 15, 2006

(65) Prior Publication Data
US 2008/0144390 A1    Jun. 19, 2008

(51) Int. Cl.
*G11C 5/14*    (2006.01)
(52) U.S. Cl. ............... 365/189.09; 365/226; 365/207; 365/210.1
(58) Field of Classification Search ........... 365/189.09, 365/226, 207, 210.1
See application file for complete search history.

(56) References Cited

U.S. PATENT DOCUMENTS

| | | | | |
|---|---|---|---|---|
| 5,873,734 | A * | 2/1999 | Griswold et al. ............ | 434/274 |
| 6,456,557 | B1 * | 9/2002 | Dadashev et al. ........... | 365/226 |
| 6,975,535 | B2 * | 12/2005 | Kim et al. ............... | 365/185.09 |
| 7,042,766 | B1 | 5/2006 | Wang et al. | |
| 7,113,442 | B2 | 9/2006 | Kurihara | |
| 7,120,050 | B2 | 10/2006 | Kawabata et al. | |
| 2005/0083112 | A1 * | 4/2005 | Shor et al. ................. | 327/541 |
| 2005/0254329 | A1 | 11/2005 | Yamashita et al. | |
| 2006/0291322 | A1 * | 12/2006 | Crippa et al. .......... | 365/230.06 |

* cited by examiner

Primary Examiner—Thong Q Le
(74) Attorney, Agent, or Firm—Eschweiler & Associates, LLC (57) ABSTRACT

A voltage regulator comprises resistor elements that mitigate variations in a program voltage (VPROG). In particular, the resistors allow copies of the voltage regulator to be fabricated more consistently across a semiconductor substrate. As such, variations in respective program voltages applied to different bitlines of a memory arrangement are mitigated. This mitigates yield loss as more devices perform as desired, thus necessitating fewer discards.

15 Claims, 5 Drawing Sheets

Fig. 9

DRAIN VOLTAGE REGULATOR

FIELD

The disclosure herein pertains to memory for computer systems and the like, and particularly to a drain voltage regulator for such memory.

BACKGROUND

It can be appreciated that many resources that go into producing semiconductor devices, including man hours for designing the devices, sophisticated equipment for fabricating the devices and expensive materials from which the devices are formed, among other things. It can thus also be appreciated that there is an ongoing desire to mitigate yield loss, where yield generally relates to the number of acceptable units produced. For example, a high yield generally corresponds to a low number of defective units. Mitigating yield loss can translate into substantial savings. Moreover, since devices are continually being reduced in size, scrapping a portion of a semiconductor substrate generally involves throwing away a number of devices, thus providing further incentive to mitigate yield loss.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

A voltage regulator comprises resistor elements that mitigate variations in a program voltage (VPROG). In particular, the resistors allow copies of the voltage regulator to be fabricated more consistently across a semiconductor substrate. As such, variations in respective program voltages applied to different bitlines of a memory arrangement are mitigated. This mitigates yield loss as more devices perform as desired, thus necessitating fewer discards.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 1:
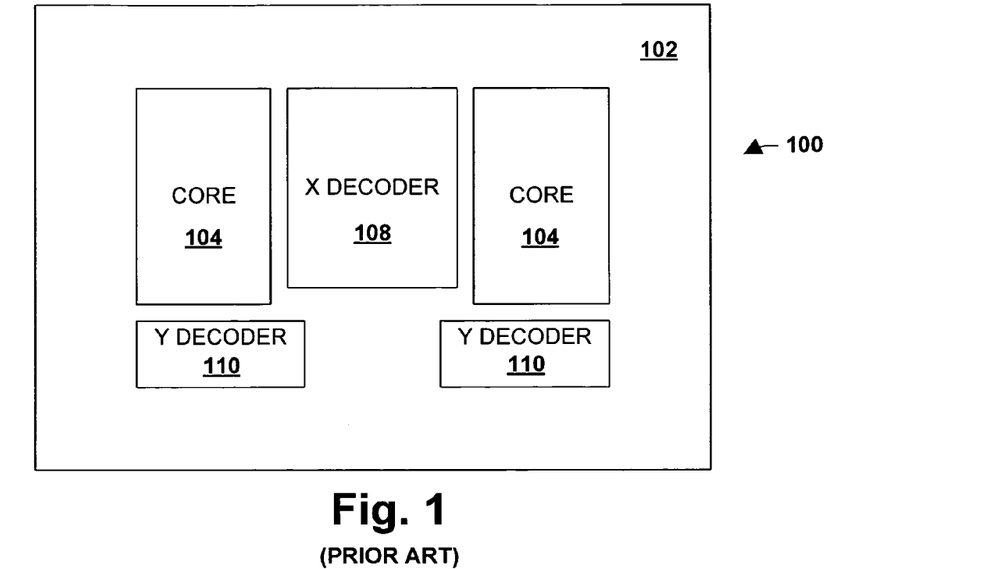
FIG. 1 is a top view of a memory arrangement.

Referring initially to FIG. 1, a top view of an exemplary memory 100 is illustrated. The memory 100 generally includes a semiconductor substrate 102 in which one or more high-density core regions 104 and one or more lower-density peripheral portions are formed. The high-density core regions typically include one or more M by N arrays 104 of individually addressable, substantially identical memory cells. The lower-density peripheral portions typically include programming circuitry for selectively addressing the individual memory cells. The programming circuitry is represented in part by and includes one or more x-decoders 108 and one or more y-decoders 110 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
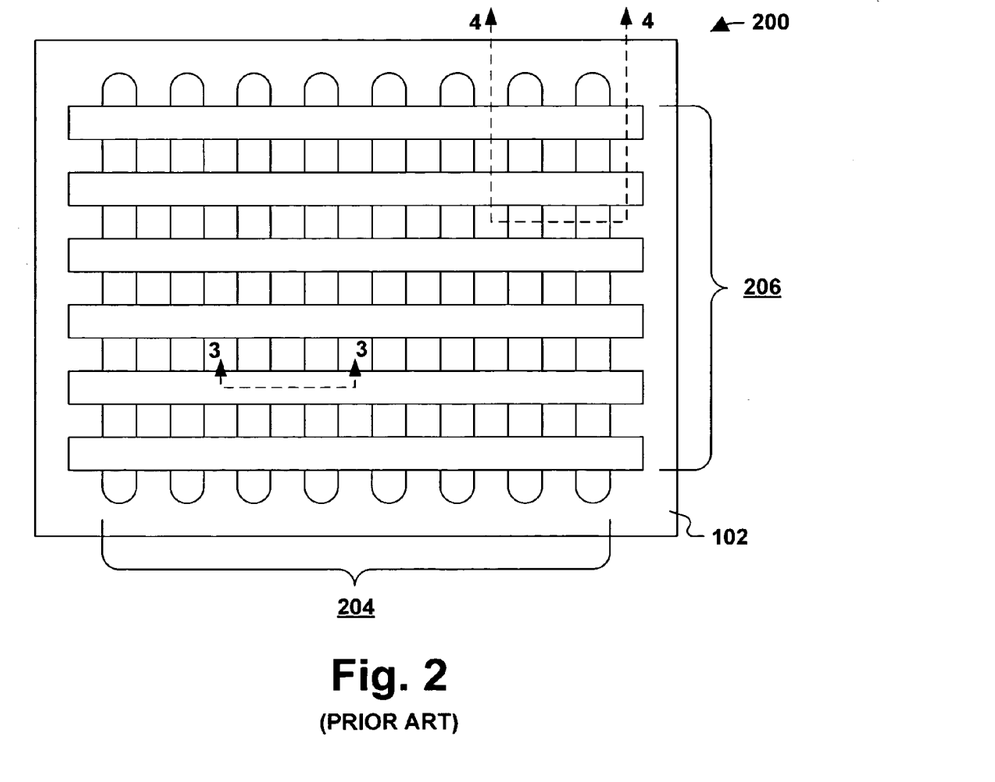
FIG. 2 is a top view of at least a portion of a memory core.

Referring to FIG. 2, a top view is presented of at least a portion 200 of a memory core, such as may include at least part of one of the M by N array cores 104 depicted in FIG. 1. The memory 200 is formed upon a semiconductor substrate 102 and has a plurality of implanted bitlines 204 extending substantially parallel to one another, and a plurality of overlying wordlines 206 extending substantially in parallel to one another and at substantially right angles to the implanted bitlines 204. It will be appreciated that the wordlines 206 and bitlines 204 have contacts and interconnections (not shown) to programming circuitry such as may be represented, at least in part, by the x-decoders 108 and y-decoders 110 depicted in FIG. 1.

Figure 3:
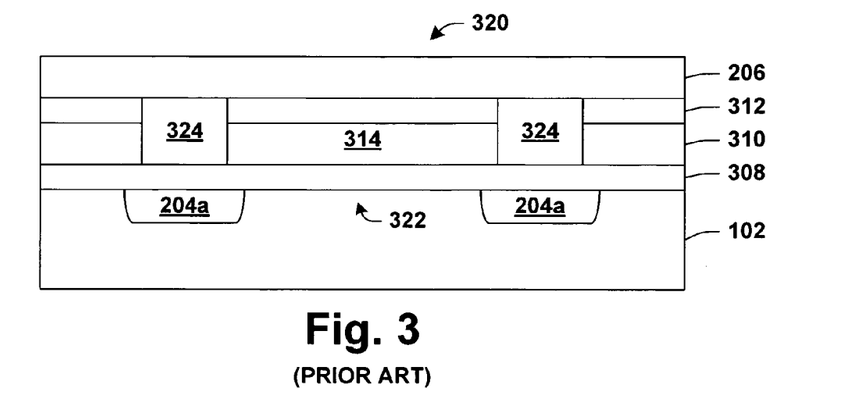
FIG. 3 is a cross sectional view of a type of memory cell.

FIG. 3 is a cross-sectional view of a portion of the memory 200 of FIG. 2 taken along lines 3-3. The memory 200 is formed upon the semiconductor substrate 102 and has conductive bitlines 204a and 204b formed therein. A first layer of dielectric material 308 is formed above the bitlines 204, and a charge storing layer 310 is formed over the first layer of dielectric material 308. A second layer of dielectric material 312 is formed over the charge storing layer 310, with the wordline 206 formed over the second layer of dielectric material 312. Bitline contacts (not shown) can be implemented to establish electrical connection to the bitlines 204.

In the illustrated example, the charge storing layer 310 is conductive (e.g., comprises doped-polysilicon) and serves as a floating gate 314 between adjacent bitlines 204a, 204b and under the wordline 206 to operatively form a "floating gate" memory device (or cell) 320. It will be appreciated that, for respective cells, adjacent pairs of bitlines form conductive regions that function as a source and a drain during various programming, verifying, reading and erasing operations. A channel region 322 is established in the substrate 102 between these source and drain regions, and current flow within this channel region 322 is controlled, at least in part, by the application of voltage to the corresponding wordline 206 that functions as a gate electrode or control gate. A dielectric material 324 is present in the illustrated example to electrically separate adjacent floating gates 314 from one another.

Figure 4:
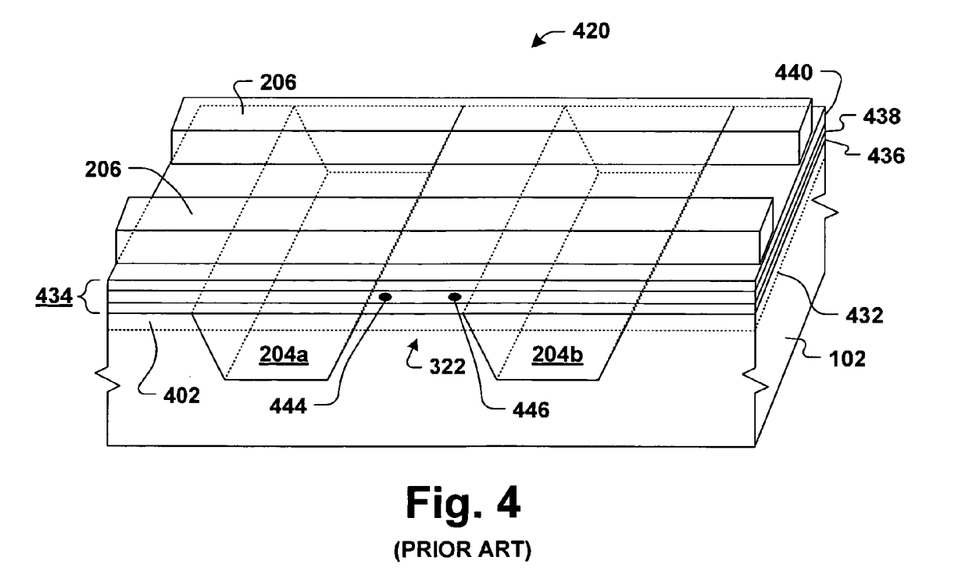
FIG. 4 is a cross sectional perspective view of a type of memory cell.

FIG. 4 is a perspective view of a portion of the memory 200 of FIG. 2 taken along lines 4-4 to illustrate a dual or mirror bit type of memory cell 420. As before, the device is formed upon the semiconductor substrate 102—which is doped with a p-type impurity (e.g., boron) in this example, to establish a threshold adjustment implant ($V_{tadjust}$) region 432 therein. A charge-trapping dielectric layer 434 is formed over the substrate 102. The charge-trapping dielectric layer 434 generally comprises a first insulating layer 436, a charge-trapping layer 438, and a second insulating layer 440. The first 436 and second 440 insulating layers generally comprise a dielectric material, such as silicon dioxide ($SiO_2$), and the charge-trapping layer 438 generally comprises another dielectric material, such as silicon nitride ($Si_xN_y$). This oxide-nitride-oxide configuration is commonly referred to as an ONO layer. Conductive bitlines 204a and 204b are formed in the substrate 102 under the charge trapping dielectric layer 434, with the channel region 322 established between the bitlines 204a, 204b. Wordlines 206 are formed over the charge trapping dielectric layer 434.

This arrangement allows a pair of complimentary bits to be independently programmed and read. For example, a first unit of charge can be stored in the charge trapping dielectric layer 434 adjacent to one of the bitlines 204a and a second unit of charge can be stored in the charge trapping dielectric layer 434 adjacent to the other bitline 204b. Locations 444 and 446 indicate generally where respective charges or bits of data can be stored. The charge-trapping dielectric layer 434, and more particularly the charge-trapping layer 438, enables multiple levels or bit states to be stored at locations 444 and 446. The charge trapping layer 438 makes this possible because it is non-conductive and, thus, charge instilled therein (e.g., via application of a wordline voltage) remains substantially localized at positions 444 and 446.

It will be appreciated that the cells 320 and 420 illustrated in FIGS. 3 and 4, respectively, generally comprise transistors. The application of appropriate voltages to the wordlines 206 and bitlines 204 allows respective transistors or cells to be programmed, read, verified and/or erased. The cells can be programmed to store a charge amount corresponding to one of multiple data states, such as four data states, for example. The data states can represent a two bit binary word, such as a 00, 01, 10 or 11, for example. The logical 11 can, for example, correspond to a blank or unprogrammed state. The other logical data states can, for example, be implemented by storing distinguishable amounts of charge in the memory cells 320 or 420. A lowest charged program level can correspond to the 10 data state, a medium charged program level can correspond to the 01 data state and a highest charged program level can corresponding to the 00 data state, for example. Programming the memory cells 320 and 420 to store multiple levels of charge can be referred to as MLC data storage. The floating gate memory device 320 in FIG. 3 thus has four data states in the foregoing example, while the cell 420 of FIG. 4 has sixteen data states (four data states per location 444 and 446 for a total of sixteen logical combinations).

It will be appreciated that the memory cells 320 and 420 can be programmed with hot electron injection, also referred to as channel hot electron injection (CHE). With hot electron injection, a voltage is applied to a bitline 204 (e.g., that is functioning as the drain) and to a wordline 206 (e.g., that is functioning as a control gate). The other bitline (e.g., that is functioning as the source) provides carriers (e.g., electrons) for the CHE programming and may be biased as well. The voltages applied to the gate, source and drain generate a vertical electric field through dielectric layers and a lateral electric field along the channel 322. At a given threshold voltage, the channel 322 inverts so that electrons are drawn off the source and begin accelerating toward the drain. As the electrons move along the length of the channel 322, they gain energy and, upon attaining enough energy, jump over the potential barrier of the bottom dielectric layer 308, 436 and into the gate 314, 438 where they become trapped.

Verifying the programmed state of the memory devices 320, 420 and reading the memory device 320, 420 can be carried out in similar manners. For example, to read the memory devices, a voltage can be applied to one of the bitlines 204a, which is also referred to as the drain during verify and read operations, and a voltage can be applied to the corresponding wordline or control gate 206. The other bitline 204b, which is also referred to as the source during verify and read operations, can be grounded. During these operations, an amount of current drawn across the channel 322 can be used as an indication of memory device threshold voltage and can be compared against a reference current(s) (as indications of reference threshold voltages) to determine the data state of the "read" memory device.

Figure 5:
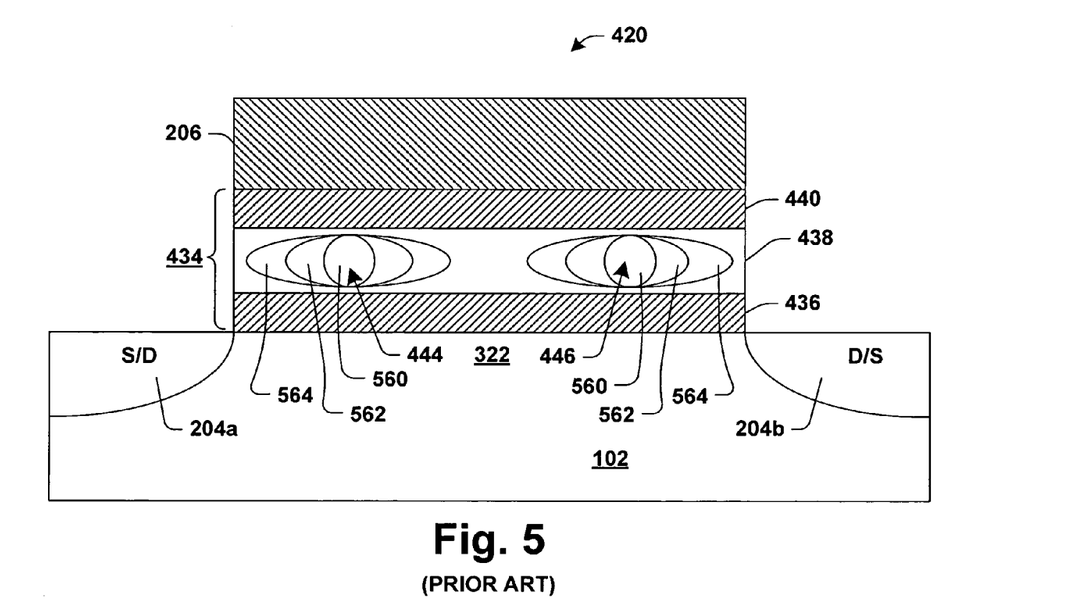
FIG. 5 is a cross sectional view of a type of memory cell illustrating various amounts of charge stored in different locations of the cell.

FIG. 5 is a cross sectional view of a dual bit memory cell 420, such as that described above with respect to FIG. 4, illustrating the capability of the cell to store varying degrees of charge at dual bit locations 444, 446. The cell 420 includes the charge trapping dielectric layer 434 that comprises the charge trapping layer 438 sandwiched between two dielectric layers 436, 440. The charge trapping dielectric layer 434 is formed over the substrate 102 wherein the bitlines 204a, 204b are formed. A wordline 206 that serves as a control gate is formed over the charge trapping dielectric layer 434, and a channel exists in the substrate 102 between the bitlines 204a, 204b.

Figure 6:
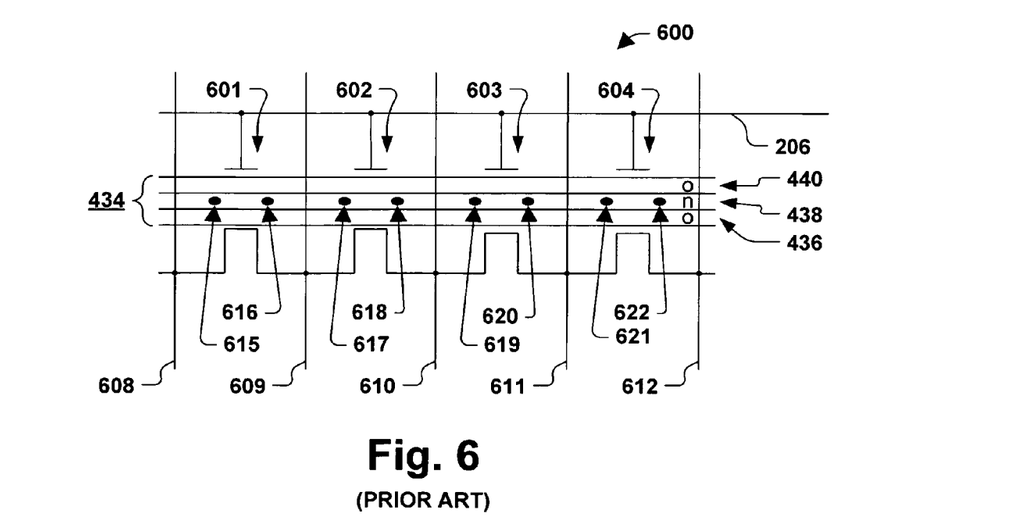
FIG. 6 is a schematic diagram of multiple memory cells connected together.

The dual sided cell 420 is generally symmetrical such that the bitlines are interchangeable for use as source and drain regions. For example, the bitline 204a may serve as the source while bitline 204b serves as the drain for location 446. Similarly, bitline 204b may serve as the source while bitline 204a serves as the drain for location 444. Various amounts of charge are illustrated as being stored at locations 444 and 446. By way of example, the lowest amount of charge 560 may correspond to the 10 data state, the next level of stored charge 562 may correspond to the 01 data state and the highest level of charge 564 may correspond to the 00 data state, with no stored charge corresponding to the 11 data state, for example. Since each of the bits FIG. 6 schematically illustrates a portion 600 of a memory such as may include at least part of the memory 100 depicted in FIG. 1. The circuit schematic shows a line or row of memory cells, which includes memory cells 601 through 604, any one of which may correspond to memory cell 420 depicted in FIG. 4 or 5, for example. The respective memory cells 601 through 604 are connected in a virtual ground type implementation such that pairs of the memory cells share a common bitline. For instance, in the example illustrated, the memory cell 601 has associated bitlines 608 and 609; the memory cell 602 has associated bitlines 609 and 610; the memory cell 603 has associated bitlines 610 and 611; and the memory cell 604 has associated bitlines 611 and 612. As such, cells 601 and 602 share bitline 609, cells 602 and 603 share bitline 610 and cells 603 and 604 share bitline 611, respectively. Additionally, the memory cells are coupled to a common wordline 206, which serves as a control gate for the cells.

The memory cells in the illustrated example represent dual bit cells such that, depending upon wordline voltages and bitline connections, the memory cells 601 through 604 are capable of writing, reading, and erasing bits at locations 615 through 622. Storage of multiple bits is made possible, at least in part, by the charge trapping dielectric layer 434 interposed between the bitlines and the wordline. The charge trapping dielectric layer 434 includes insulating layers 436, 430 (e.g., of oxide based material) that sandwich charge trapping layer 438 (e.g., of nitride based material). To perform a programming operation at location 615, for example, bitline 609 is designated as the source and bitline 608 is designated as the drain. To perform a read operation at location 615, for example, the source and drain are reversed such that bitline 608 is designated as the source and bitline 609 is designated as the drain. To read at location 616 bitline 608 serves as the drain and bitline 609 serves as the source.

It can be appreciated that the memory cells are very small and that variations in voltages applied to them can have a drastic impact on their performance. For example, the voltage applied to a bitline serving as a drain of a device has an effect on the time it takes to program that memory device. As such, the voltage applied to different bitlines should vary as little as possible so that the time it takes to program corresponding cells remains relatively consistent across the different cells. This is particularly desirable as multiple cells (e.g., in the same memory block or page) are generally programmed concurrently. If the voltages applied to the bitlines vary by too wide of a margin, the memory cells will not operate as desired (e.g., meeting a quality control threshold), and thus may have to be scrapped. As mentioned above, such reductions in yield are undesirable because, among other things, as they are costly.

Figure 7:
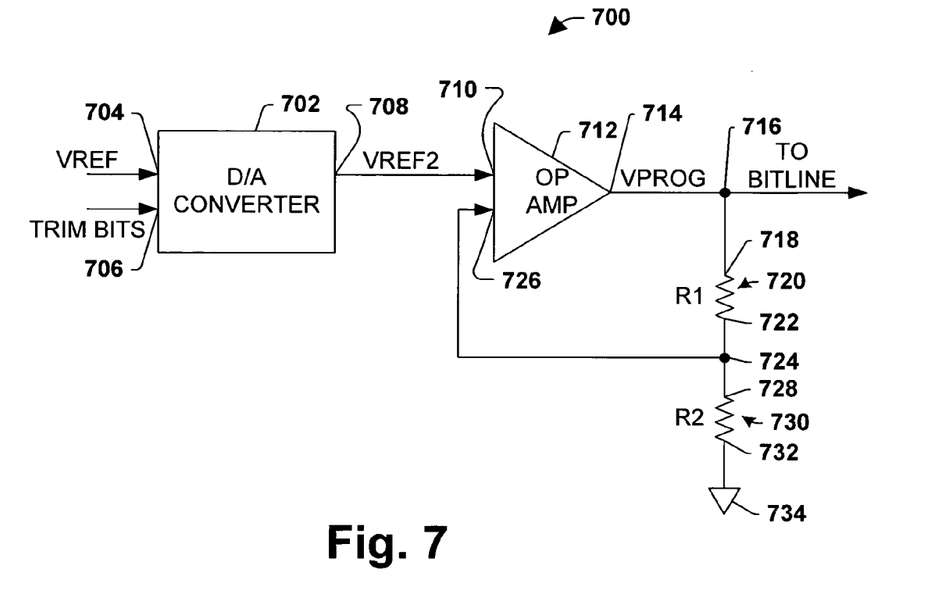
FIG. 7 is a schematic diagram of a voltage regulator comprising resistors.

FIG. 7 is a schematic diagram of a voltage regulator 700 that mitigates variations in voltages applied to bitlines. In this manner, the cells are programmed in a more uniform time frame, and thus fewer cells may have to be discarded, thereby mitigating yield loss. It will be appreciated that the voltage regulator 700 may be comprised within the peripheral portions discussed above with regard to FIG. 1. In any event, respective voltage regulators 700 would be operatively coupled to bitlines to provide programming voltages thereto.

The voltage regulator 700 comprises a digital to analog converter 702 having first 704 and second 706 inputs and an output 708. The output 708 of the digital to analog converter 702 is operatively coupled to a first input 710 of an operational amplifier 712. The operational amplifier 712 has an output 714 that is coupled to a first node 716 that is coupled to a first end 718 of a first resistor 720. A second end 722 of first resistor 720 is coupled to a second node 724 that is coupled back to a second input 726 of the operational amplifier 712. The second node 724 is also coupled to a first end 728 of a second resistor 730, a second end 732 of which is coupled to a circuit common or ground 734.

A reference voltage (VREF) (e.g., band gap reference voltage) is applied to the first input 704 of the digital to analog converter 702, while trim bits are applied to the second input 706 of the digital to analog converter 702. The trim bits are utilized by the digital to analog converter 702 in converting the reference voltage (VREF) to a second reference voltage (VREF2), which is transferred from the output 708 of the digital to analog converter 702 to the first input 710 of the operational amplifier 712. The second reference voltage (VREF2) is amplified to a program voltage (VPROG) by the operational amplifier 712. The program voltage (VPROG) is the voltage that is applied to a bitline (e.g., drain) in performing a programming operation. It can be appreciated that since the second input 726 of operational amplifier 712 is coupled to node 724 situated between resistors 720, 730, that the program voltage (VPROG) is a function of both the second reference voltage (VREF2) and the first 720 and second 730 resistors.

It can be appreciated that copies of the regulator 700 can be fabricated relatively uniformly on a semiconductor substrate so that variations in respective programming voltages (VPROG) output thereby are mitigated. In particular, the resistors can be fabricated in a more consistent manner using lithographic techniques. Generally speaking lithography refers to processes for transferring one or more patterns between various media. In lithography, a light sensitive resist coating is formed over one or more layers to which a pattern is to be transferred. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., etched and/or doped).

Figure 8:
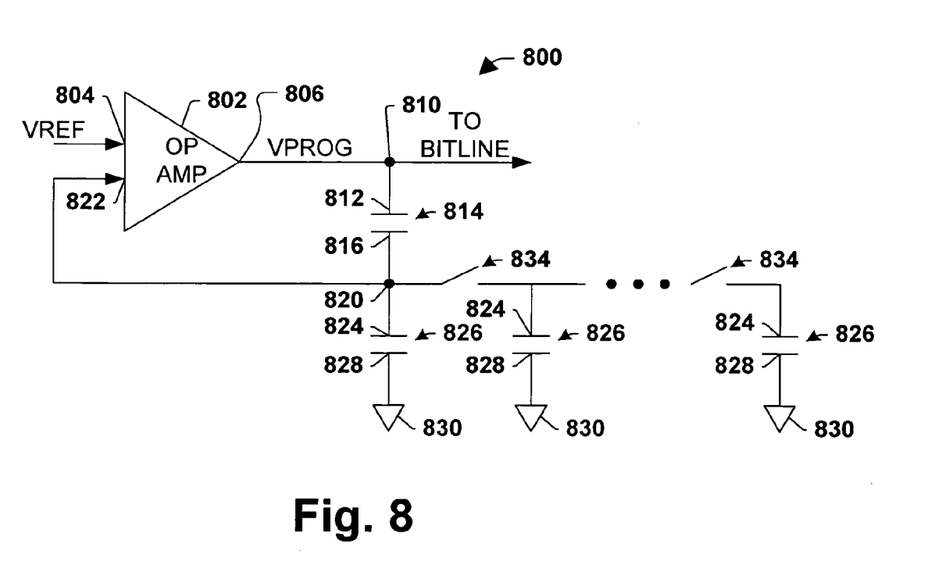
FIG. 8 is a schematic diagram of a voltage regulator comprising capacitors.

Copies of the regulator 700 comprising the resistors R1, R2 can be fabricated more consistently than a regulator comprising capacitors, for example. By way of example, FIG. 8 illustrates a voltage regulator 800 that comprises capacitors rather than resistors. The regulator 800 comprises an operational amplifier 802, a first input 804 of which receives a reference voltage (VREF). A program voltage (VPROG) is generated at the output 806 of the operational amplifier 802. The program voltage (VPROG) is administered to a bitline (e.g., drain) during a program operation.

A first node 810 couples the output 806 of the operational amplifier 802 to a first side 812 of a first capacitor 814. The second side 816 of the first capacitor 814 is coupled to a second node 820 which is coupled back to the second input 822 of the operational amplifier 802. The second node 820 is also coupled to respective first sides 824 of one or more capacitors 826, the respective second sides 828 of which are coupled to a circuit common or ground 830. The second capacitors 826 are selectively coupled in parallel by switches or fuses 834 that are controlled by trim bits. As such, the value applied to the second input 822 of the operational amplifier 802 is a function of the number of capacitors 826 connected in parallel, which is controlled by trim bits.

Unlike resistors 720, 730 in voltage regulator 700, however, capacitors fabricated on semiconductor substrates with lithographic techniques may vary (e.g., from die to die). As such, respective program voltages (VPROG) applied to bitlines may vary. By way of example, a voltage of 5 volts may be applied to one bitline while a voltage of 5.3 volts may be applied to a different bitline. Such a (0.3 volt) variation in voltage can affect programming speed by a factor of 4, for example. It can be appreciated that programming different memory cells at such different speeds may make a memory arrangement unacceptable for its intended application. Such an arrangement may thus be regarded as defective and discarded, at a not so insignificant cost. Additionally, pre-charging is generally required with capacitors to establish linear operation, whereas no such pre-charging is generally required with resistors. Also, trimming capacitors can give rise to parasitic capacitances which can cause further disparities among voltage regulators.

Figure 9:
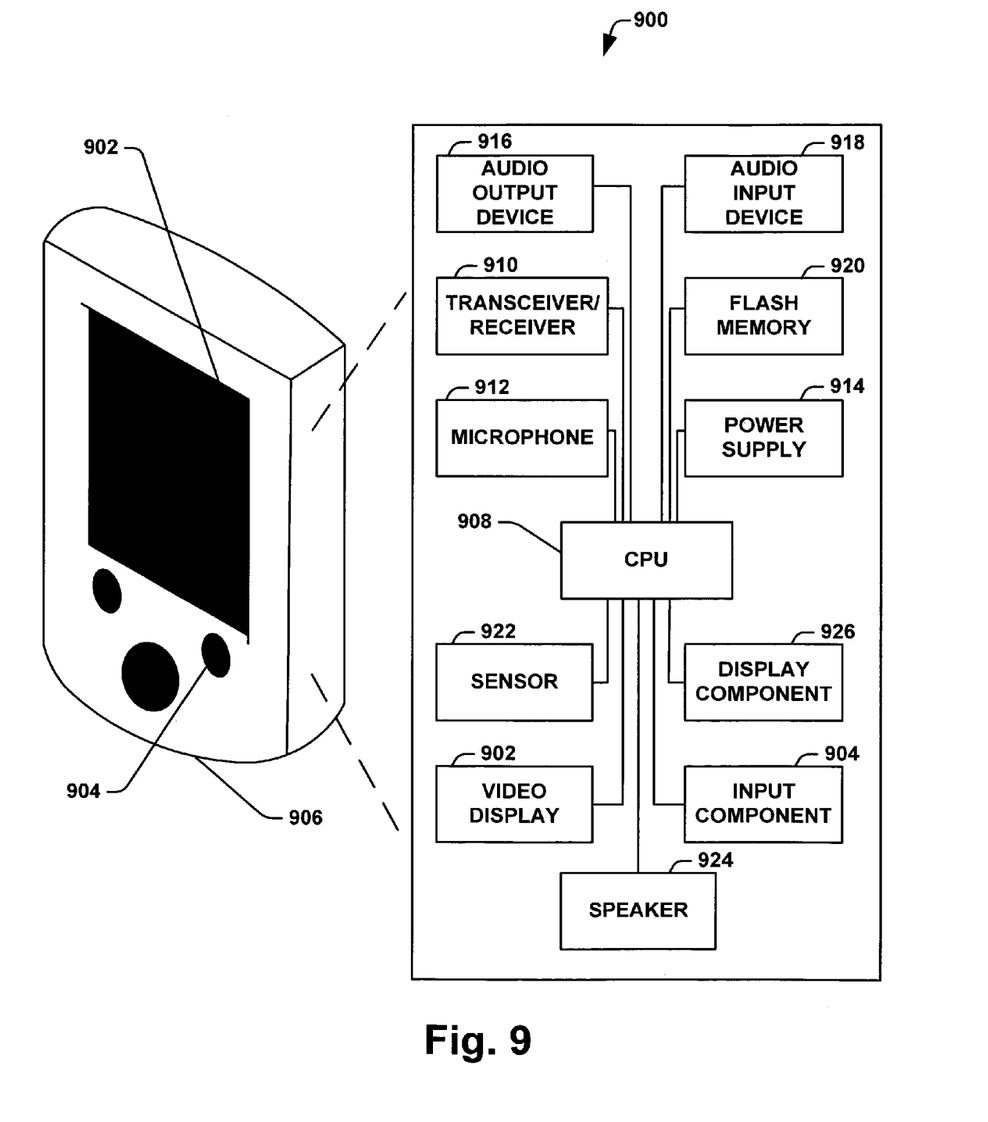
FIG. 9 is a schematic diagram of an electronic device where one or more aspects of the disclosure herein may be implemented.

FIG. 9 illustrates an example of a (portable) electronic device, such as a communication device or Personal Data Assistant (PDA) 900, for example, where one or more aspects of the disclosure herein may be implemented. The communication device 900 comprises a video display 902, one or more user input components 904, a housing 906, a CPU 908, a transceiver and/or receiver 910, a microphone 912, a power supply 914, an audio output device 916, an audio input 918, memory 920, various sensors 922, and speaker(s) 924. The memory 920 of the communication device 900 may comprise, for example, a voltage regulator as described herein. The one or more user input components 904 can include a keypad, buttons, dials, pressure keys, and the like. The video display 902 can be a liquid crystal display, a plasma display, an LED display, and the like, for visually displaying information. The CPU 908 can be configured to communicate with the audio input device 918, the audio output device 916 and a display component 926. The display component 926 can be separate and distinct from the video display 902. The CPU 908 can execute control functions based on inputs from the user, entered using the one or more user input components 904, for example. Based on those inputs, for example the display component can display a graph, a photo, a map, a chart, a video, and the like. The communication device 900 can also be configured to output data as an audio signal, for example a song, a message, a warning sound, various tones, recordings, etc. The communication device 900 can be configured to communicate with other electronic devices, for example computers, cell phones, other PDAs, and the like. The communication device 900 can also be configured to (wirelessly) transmit and/or receive data. This is done utilizing the transmitter/receiver 910 to either transmit or receive data. Additionally, sensors 922 can be utilized to sense data external to the PDA 900, for example, temperatures, radiation levels, pressures, and the like. It will be appreciated that a voltage regulator as described herein can similarly be implemented in cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like.

It will be appreciated that, substrate and/or semiconductor substrate as used herein may comprise any type of semiconductor body (e.g., silicon, SiGe, SOI) such as a semiconductor wafer and/or one or more die on a wafer, as well as any other type of semiconductor and/or epitaxial layers associated therewith. Additionally, layers described herein, can be formed in any suitable manner, such as with spin on, sputtering, growth and/or deposition techniques, etc. Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A voltage regulator configured to supply a program voltage (VPROG) to a bitline of a memory arrangement, comprising:

a digital to analog converter comprising a first input, a second input and an output;

an operational amplifier comprising a first input, a second input and an output;

a first resistor, a first end of which coupled to a first node coupled to the output of the operational amplifier, a second end of which coupled to a second node coupled to the second input of the operational amplifier; and a second resistor, a first end of which coupled to the second node, a second end of which coupled to circuit common or ground;

a reference voltage (VREF) applied to the first input of the digital to analog converter, trim bits applied to the second input of the digital to analog converter, a second reference voltage (VREF2) transferred from the output of the digital to analog converter to the first input of the operational amplifier, and the program voltage (VPROG) output from the operational amplifier.

2. The regulator of claim 1, the output of the operational amplifier operatively coupled to a bitline of a memory arrangement.

3. The regulator of claim 2, the bitline serving as a drain of a memory cell being programmed.

4. The regulator of claim 3, the program voltage (VPROG) a function of the second reference voltage (VREF2) and the first and second resistors.

5. A memory arrangement comprising:

a plurality of bitlines formed in a semiconductor substrate, the plurality of bitlines substantially parallel to one another;

a plurality of wordlines formed over the plurality of bitlines, the plurality of wordlines substantially parallel to one another and substantially perpendicular to the plurality of bitlines, memory cells generally established at intersections of bitlines and wordlines; and respective voltage regulators coupled to the bitlines to apply respective program voltages (VPROG) thereto to program memory cells, the program voltages a function of resistive elements of the voltage regulators, the respective voltage regulators comprising a conversion component coupled between an input for receiving a reference voltage (VREF) and an output for outputting the program voltages (VPROG) and configured to convert the reference voltage to the program voltage as a function of the resistive elements.

6. The arrangement of claim 5, respective voltage regulators comprising:

a digital to analog converter comprising a first input, a second input and an output;

an operational amplifier comprising a first input, a second input and an output;

a first resistor, a first end of which coupled to a first node coupled to the output of the operational amplifier, a second end of which coupled to a second node coupled to the second input of the operational amplifier; and a second resistor, a first end of which coupled to the second node, a second end of which coupled to circuit common or ground;

a reference voltage (VREF) applied to the first input of the digital to analog converter, trim bits applied to the second input of the digital to analog converter, a second reference voltage (VREF2) transferred from the output of the digital to analog converter to the first input of the operational amplifier, and the program voltage (VPROG) output from the operational amplifier.

7. The arrangement of claim 5, respective voltage regulators comprising:

an input for receiving a reference voltage (VREF);

an output for outputting the program voltage (VPROG);

one or more resistive elements; and a conversion component configured to convert the reference voltage to the program voltage as a function of the resistive elements.

8. The arrangement of claim 5, respective voltage regulators comprising:

an input for receiving a reference voltage (VREF);

an output for outputting the program voltage (VPROG);

one or more resistive elements; and means for converting the reference voltage to the program voltage as a function of the resistive elements.

9. A voltage regulator configured to supply a program voltage (VPROG) to a bitline of a memory arrangement, comprising an input for receiving a reference voltage (VREF) and an output for outputting the program voltage (VPROG) to the bitline as a function of one or more resistive elements of the voltage regulator and a conversion component coupled between the input and output and configured to convert the reference voltage to the program voltage as a function of the resistive elements.

10. The regulator of claim 9, comprising:

a conversion component coupled between the input and output and configured to convert the reference voltage to the program voltage as a function of the resistive elements.

11. The regulator of claim 9, comprising:

means for converting the reference voltage to the program voltage as a function of the resistive elements, the means for converting coupled between the input and output.

12. A voltage regulator configured to supply a program voltage (VPROG) to a bitline of a memory arrangement, comprising:

an input for receiving a reference voltage (VREF);

an output for outputting the program voltage (VPROG) to the bitline;

one or more resistive elements; and means for converting the reference voltage to the program voltage as a function of the resistive elements and coupled between the input and output.

13. An electronic device, comprising:

a user input configured to allow a user to input data;

a user output configured to output data to a user;

a central processing unit (CPU) operatively coupled to the user input and the user output and configured to receive and process the user input to output the user output; and a memory operatively coupled to the CPU and configured to receive data from and send data to the CPU, the memory comprising a voltage regulator configured to supply a program voltage (VPROG) to a bitline of a memory, the voltage regulator comprising an input for receiving a reference voltage (VREF) and an output for outputting the program voltage (VPROG) to the bitline as a function of one or more resistive elements of the voltage regulator, at least one of:

the voltage regulator comprising a conversion component coupled between the input and output and configured to convert the reference voltage to the program voltage as a function of the resistive elements, the voltage regulator comprising means for converting the reference voltage to the program voltage as a function of the resistive elements, the means for converting coupled between the input and output, the memory comprising:

a plurality of bitlines formed in a semiconductor substrate, the plurality of bitlines substantially parallel to one another;

a plurality of wordlines formed over the plurality of bitlines, the plurality of wordlines substantially parallel to one another and substantially perpendicular to the plurality of bitlines, memory cells generally established at intersections of bitlines and wordlines; and respective voltage regulators coupled to the bitlines to apply respective program voltages (VPROG) thereto to program memory cells, the program voltages a function of resistive elements of the voltage regulators the voltage regulator comprising:

a digital to analog converter comprising a first input, a second input and an output;

an operational amplifier comprising a first input, a second input and an output;

a first resistor, a first end of which coupled to a first node coupled to the output of the operational amplifier, a second end of which coupled to a second node coupled to the second input of the operational amplifier; and a second resistor, a first end of which coupled to the second node, a second end of which coupled to circuit common or ground;

the reference voltage (VREF) applied to the first input of the digital to analog converter, trim bits applied to the second input of the digital to analog converter, a second reference voltage (VREF2) transferred from the output of the digital to analog converter to the first input of the operational amplifier, and the program voltage (VPROG) output from the operational amplifier, and the bitline serving as a drain of a memory cell being programmed.

14. The device of claim 13, the program voltage (VPROG) a function of the second reference voltage (VREF2) and the first and second resistors.

15. The device of claim 13, the electronic device comprising at least one of a communication device, Personal Data Assistant (PDA), cell phone, memory stick, flash drive device, video camcorder, voice recorder, USB flash drive, fax machine, flash memory laptop, MP3 player, digital camera, home video game console, hard drive and memory card.

* * * * *